United States Patent [19]

Watson

[11] 4,098,001
[45] Jul. 4, 1978

[54] REMOTE CENTER COMPLIANCE SYSTEM

[75] Inventor: Paul C. Watson, Arlington, Mass.

[73] Assignee: The Charles Stark Draper Laboratory, Inc., Cambridge, Mass.

[21] Appl. No.: 732,286

[22] Filed: Oct. 13, 1976

[51] Int. Cl.² .............................................. G01B 5/25
[52] U.S. Cl. .............................. 33/169 C; 33/185 R; 33/189
[58] Field of Search ............ 33/169 C, 172 D, 174 Q, 33/185 R, 189, 191

[56] References Cited
U.S. PATENT DOCUMENTS

| 2,994,131 | 8/1961 | Gaylord | 33/185 R |
| 3,241,243 | 3/1966 | Speer | 33/189 X |
| 3,601,897 | 8/1971 | Muller | 33/172 D |
| 3,999,299 | 12/1976 | Johnson | 33/185 R |

Primary Examiner—William D. Martin, Jr.
Attorney, Agent, or Firm—Joseph S. Iandiorio

[57] ABSTRACT

A remote center compliance system including means for establishing rotational motion about a center remote from the means for establishing the rotational motion and in two directions transverse to radii from the remote center.

2 Claims, 15 Drawing Figures

REMOTE CENTER COMPLIANCE SYSTEM

FIELD OF INVENTION

This invention relates to a remote center compliance system and more particularly to such a system which enables rotation in two directions about a remote center and which enables translational motion as well as rotational motion.

BACKGROUND OF INVENTION

In many industrial, scientific and other applications, it is necessary to perform insertion operations, such as putting pegs in holes, screws into threaded apertures, placing parts into specific locations, and similar operations. Conventionally, such operations could be done by hand by humans, but this work is tedious and boring, and often requires extremely precise and delicate placement which may not be possible for humans to accomplish for extended periods of time or with the proper delicacy. In addition, the use of human labor is often extremely expensive. Mechanical hands and arms using servo and force sensors have been used in many applications. These devices are typically extremely expensive because of the complex circuitry required to sense and feed back operational signals to the servos, and because of the relatively high cost of the computers and software which must be used to operate such systems. More recently, a variation on these mechanical devices has been introduced which searches in one dimension for a periphery and then returns some predetermined distance to an assumed middle point and then performs the same operation in a perpendicular direction. This too is a relatively expensive and complex device. Proximate center mechanical centering devices have been suggested for such applications, but they necessarily require the presence of part of their supporting structure in the work area, where it may interfere with the operations of the device.

While human operators are limited as to the size and force of the tasks they can perform, the automated devices are not so limited but they do require increasing energy with increasing size and force range demands.

SUMMARY OF INVENTION

It is therefore an object of this invention to provide a remote center compliance system which may be used in an assembly or insertion device.

It is a further object of this invention to provide an improved insertion or assembly device which is extremely simple and inexpensive.

It is a further object of this invention to provide such a device which requires no energy sources, no people, and no sensors and servos for its operation.

The invention results from the realization that by creating virtual rotation centers located beyond the remote center compliance system mechanism and near or at the end of the insertion member, forces and moments may be created corresponding to a gentle pulling of the member to be inserted into the hole, and the further realization that by the addition of a translational motion device concatenated with the rotational motion device and the operator member, the operator member is enabled to seek the hole with translational motion and then, in a second separate, decoupled, independent rotational motion, rotate to bring the axis of the operator member in line with that of the hole.

The invention features a remote center compliance system which may be used in a mechanical assembler or insertion device. It includes means for establishing rotational motion in directions transverse (tangential) to the radii of and about a center remote from the means for establishing the rotational motion. In a preferred embodiment the means for establishing the rotational motion may include first and second members and means for relatively, rotatably engaging the first and second members with each other for relative rotation about a center remote from the first and second members. The means for relatively, rotably engaging may include at least three rotational interconnection elements located along portions of spherical radii emanating from the remote center, and each such rotational interconnection element may include two major motion portions, one proximate each of the first and second members.

Also in a preferred embodiment, operator means are fixed to the means for establishing the rotational motion, and the center of rotational motion is at or near the end of the operator means.

The system may further include means for establishing translational motion which is concatenated with the means for establishing rotational motion, and the operator means may be connected to either one of those means for establishing. The means for establishing translational motion may include third and fourth members relatively, translationally moveable with respect to each other and means for relatively, translationally engaging the third and fourth members with each other. Each of the rotational and translational interconnection elements may include two major motion portions, one proximate each of their respective associated members.

DISCLOSURE OF PREFERRED EMBODIMENT

Other objects, features and advantages will occur from the following description of a preferred embodiment and the accompanying drawings, in which.

The invention may be accomplished using a remote center compliance system in a mechanical assembler or insertion device. The remote center compliance system includes means for establishing rotational motion in directions, transverse (tangential) to radii of, and remote about, a center remote from the means for establishing rotational motion. The means for establishing the rotational motion may include first and second members and means for relatively, rotatably engaging the first and second members with each other for relative rotation about a center remote from the first and second members. The means for relatively, rotatably engaging may include at least three rotational interconnection elements located along portions of spherical radii emanating from the remote center. Such elements may include ball bearings, springs, wires, flexure elements and the like. Flexure elements and springs may include two major motion portions, one proximate each of the first and second members, rather than being uniformly flexible along their entire length. Or they may be uniform in cross section throughout, such as are rods and wires.

The system may also include means for establishing translational motion which is concatenated with the means for establishing rotational motion. Operator means may be connected to one of those means for establishing while the other means for establishing is connected to the machine ground. The machine may be a milling machine, a robot arm, or the like. Rotational and translational means may share intermediate members.

Figure 1:
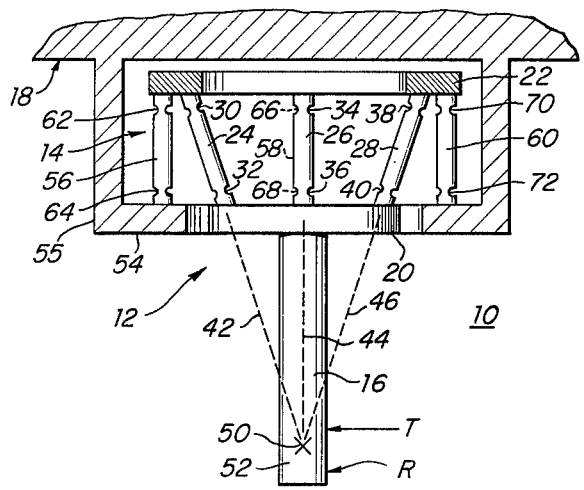
FIG. 1 is a schematic cross-sectional diagram of a remote center compliance system according to this invention using rotational and translational mechanisms.

There is shown in FIG. 1 a remote center compliance system 10 including means for establishing rotational motion 12 and means for establishing translational motion 14. An operating member, rod 16, is extended outwardly from the means for establishing rotational motion 12, and the means for establishing rotational motion 12 and translational motion 14 are concatenated and extended from the fixed portion 18 of the machine or device in which they are applied. Rod 16 is typically replaced by or carries a robot hand, mechanical grip, claws, clamps or the like which manipulate the part to be inserted or directed by the mechanism. The means for establishing rotational motion includes a member, plate 20, and another member, ring 22, which are relatively, rotatably interconnected by means such as flexures 24, 26, and 28. Flexures 24, 26, and 28 have major motion portions, pairs of reduced portions 30, 32; 34, 36; 38, 40, respectively, conveniently located proximate associated plates 20 and 22 in order to concentrate the motion at those reduced portions. Flexures 24, 26, and 28 lie along portions or radii 42, 44, 46, which emanate from center 50 which is remote from the system: it exists at, near, or beyond the free end 52 of rod 16.

Figure 2:
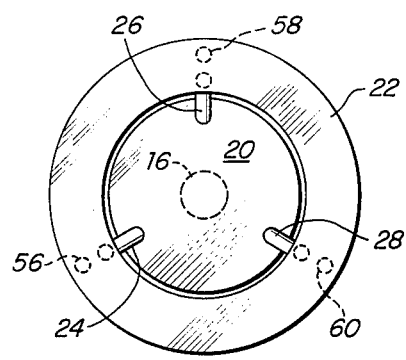
FIG. 2 is a plan view of the system of FIG. 1 viewing from the intermediate coupling ring downwardly.

The means for establishing translational motion 14 includes a member such as lip 54 integral with cylindrical wall 55 of machine 18, and another member which can be constituted by plate 22, which thus forms a part of both the translational and rotational mechanisms. Means for establishing translational motion 14 also includes, between plate 22 and lip 54, flexures 56, 58 (blocked from view in FIG. 1 by flexure 26, see FIG. 2), and flexure 60, each of which has reduced portions 62, 64; 66, 68; 70, 72, respectively, similar to those associated with flexures 24, 26, and 28. A translational force, T, on the end 52 of rod 16 causes relative translational motion between plates 20 and 22 by means of flexures 56, 58, and 60, while a rotational force, R, about the end 52 causes relative rotational motion between plates 20 and 22 about remote center 50 by means of flexures 24, 26, and 28.

Figure 3:
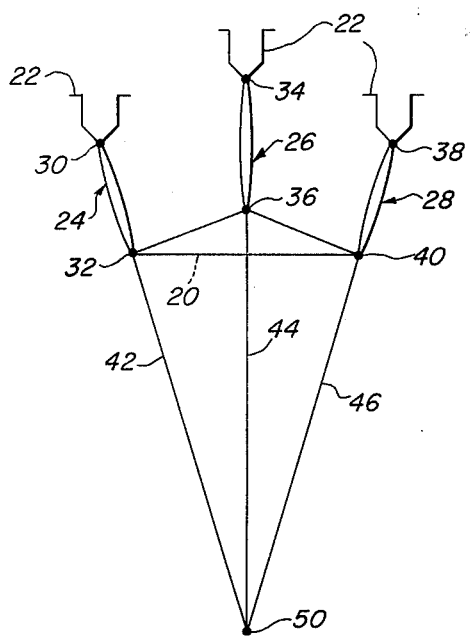
FIG. 3 is a diagram showing the basic geometry of the rotational mechanism of the system of FIG. 1.

The basic geometry of the means for establishing rotational motion 12 is depicted in FIG. 3, where flexures 24, 26, and 28 are shown disposed along portions of radii 42, 44, and 46 emanating from remote center 50, to form a triangular pattern typically but not necessarily equilateral.

Figure 4:
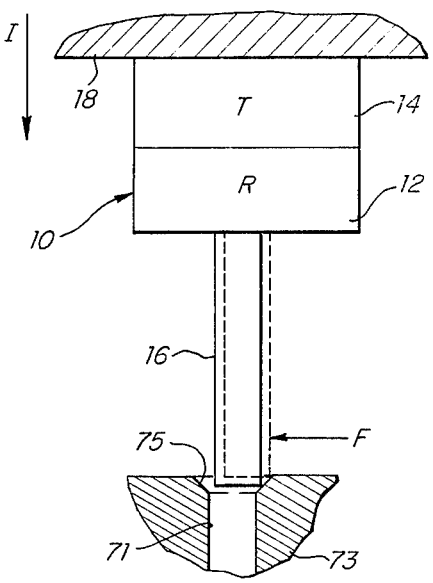
FIG. 4 is a schematic block diagram showing a remote center compliance system performing translational motion according to this invention.
Figure 4A:
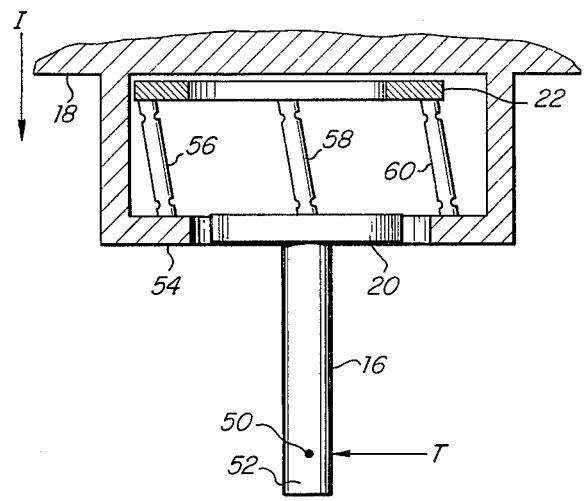
FIG. 4a is an illustration similar to FIG. 1, with portions omitted for clarity, showing the translational shift of the system in response to a rectilinear force.

In operation, system 10, FIG. 4, is moved axially with machine part 18 to move rod 16 into hole 71 in work piece 73. Fine adjustment occurs by means for establishing translational motion 14 in response to force F developed as end 52 of rod 16 is guided by chamfer 75 as rod 16 experiences force I. The means for establishing translational motion 14 is shown in its shifted position in FIG. 4a, where the flexures 24, 26, and 28, forming a portion of the means for establishing rotational motion 12, have been omitted for clarity.

The fine adustment afforded by the remote center compliance system 10 according to this invention, after the machine 18 brings rod 16 to an approximate position over hole 71, enables precise translational alignment of rod 16 with hole 71, as machine 18 applies an insertion force I to push rod 16 into hole 71 or, as is more often the case, to push some part or tool replacing or held by rod 16 into hole 71.

Figure 5:
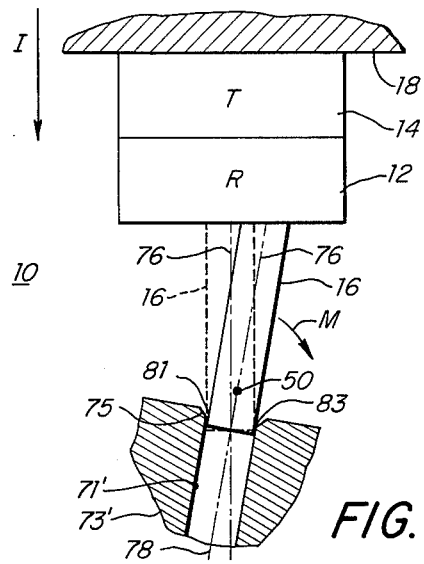
FIG. 5 is a block diagram of a remote center compliance system performing rotational motion according to this invention.
Figure 5A:
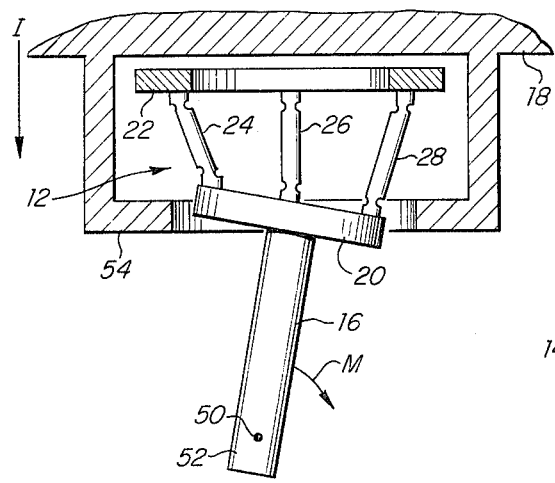
FIG. 5a is an illustration similar to that shown in FIG. 1 with the means for establishing rotational motion in a complying condition and portions of the translational motion omitted for clarity.

The means for establishing rotational motion 12 operates in a similar fashion to make fine, precise adjustment. For example, as shown in FIG. 5, when rod 16 has been located at hole 71', perfect alignment is not yet obtained because the axis 76 of rod 16 is not coincident with the center axis 78 of hole 71'. However, upon application of the insertion force I by machine 18, rod 16 makes contact at point 81 or 83 and then at the other point, subsequent to which a rotational moment, arrow M, is applied and is enabled, by means for establishing rotational motion 12, to rotate rod 16 to the position shown in full lines, whereupon the axis 76 of rod 16 becomes coincident with the axis 78 of hole 71'. The remote center compliance system 10 may be made adaptive so that rod 16 may be used in various lengths or replaced with various length tools and pieces to be manipulated by providing suitable adjustment means for controlling the inclination of flexures 24, 26, and 28 to properly position remote center 50 with respect to each of the different length rods 16, tools or other work pieces that may be used. The position of the means for establishing rotational motion 12 in this condition is shown in FIG. 5a, where the non-relevant portions of the means for establishing translational motion 14 have been omitted for clarity.

Figure 6:
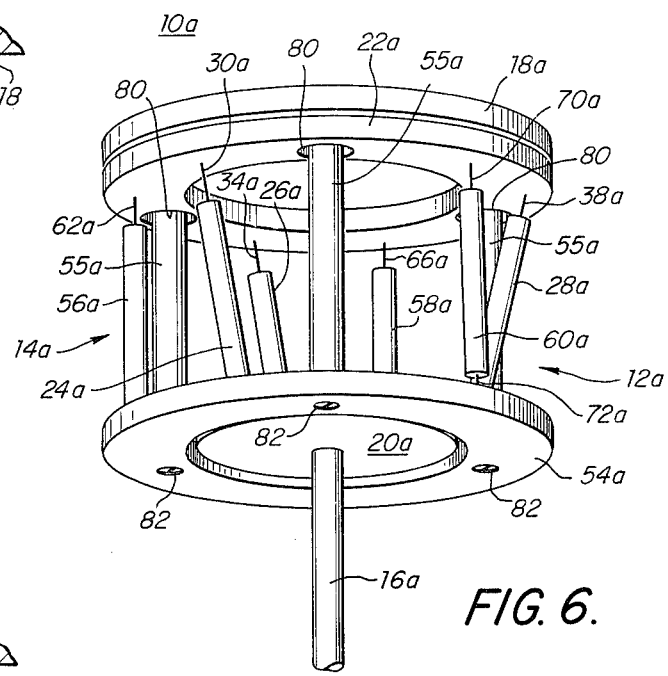
FIG. 6 is an axonometric view of an alternate construction of a remote center compliance system similar to FIG. 1.

Remote center compliance system 10 according to this invention can be alternatively constructed as shown in FIG. 6, where like parts having like function have been given like numbers with respect to FIG. 1 accompanied by a lower case a.

Rod 16a is fixed to plate 20a, which forms a portion of the means for establishing rotational motion 12a, which also includes flexures 24a, 26a, and 28a having reduced portions 30a, 34a, and 38a, proximate their ends which engage with annular plate 22a. Structures 26a, 28a, and 30a also include reduced portions 32a, 36a, and 40a at their lower ends proximate plate 20a, but these portions are not visible in FIG. 6. Means for establishing translational motion 14a includes flexures 56a, 58a, and 60a, which interconnect ring 54a analogous to lip 54, FIG. 1; and annular plate 22a. Flexures 56a, 58a, and 60a include reduced portions 64a, 68a, and 72a at their lower ends proximate annular plate 54a, only one of which reduced portions 72a is visible in FIG. 6. Ring 54a interconnects with machine 18a by means of three rods, each designated 55a, which pass through holes 80 in annular plate 22a to fasten to machine 18a at their upper ends and which are fastened directly to annular plate 54a at their lower ends by means of screws 82.

Figure 7:
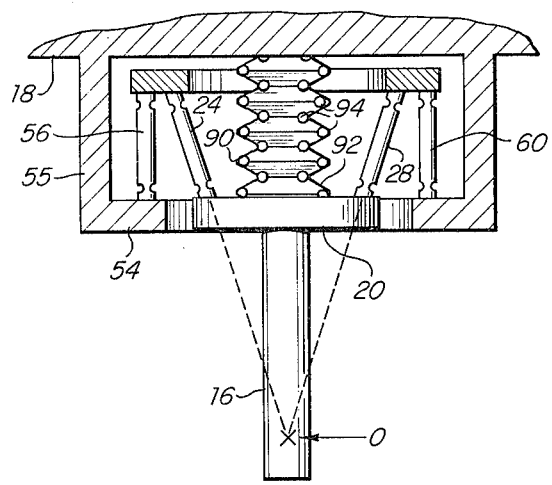
FIG. 7 is an illustration similar to that shown in FIG. 1 with a centrally located bellows to prevent twisting of the system.

In applications where operator or rod 16 is to be used to apply a torque or turning force to a workpiece, such as threading a screw into a threaded hole or the like, it may be desirable to prevent even slight twisting of rod 16. For this purpose, bellows 90, FIG. 7, composed of a casing 92 and support wire 94, may be fixed to machine 18 and to plate 20 to permit translational motion and rotational motion in directions transverse to radii from the remote center, but prevent a third rotational motion, i.e. a twisting motion of rod 16. Bellows 90 need not be introduced through the center of the device but may as well be externally attached so that it envelops the entire mechanism. For example, it may be attached to machine 18 external to cylindrical wall 55 and come down and around lip 54 to interconnect with rod 16.

Although thus far the system of this invention has been shown with mechanisms employing only flexures, this is not a necessary limitation of the invention, as the interconnection between the different members of each of the rotational and translational portions of the system may be made by springs, ball bearings, and various other devices.

Figure 8:
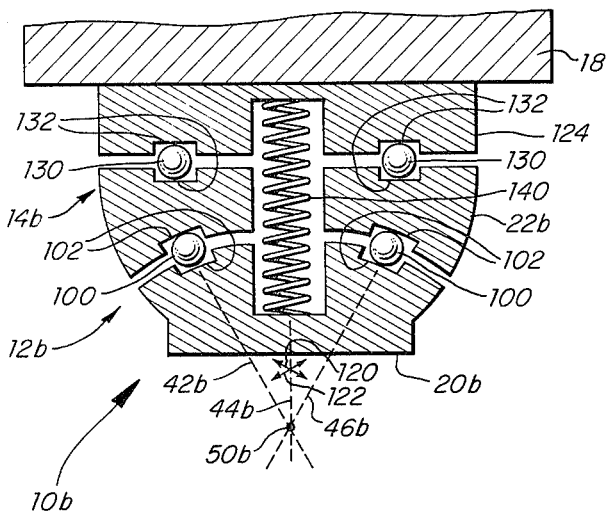
FIG. 8 shows an alternative construction of a remote center compliance system according to this invention.

For example in FIG. 8, where like parts have been given like numbers with respect to previous figures accompanied by a lower case b, remote center compliance system 10b according to this invention is fixed to machine 18 and includes a rotary mechanism 12b and translational mechanism 14b. Rotational mechanism 12b includes plate 20b which is relatively, rotatably moveable with respect to an intermediate plate 22b by means of ball bearings 100; although only two are shown in FIG. 8, there may be more than three, as there may be more than three flexures in FIGS. 1 and 6. Each of the ball bearings is located along the radii 42b, 44b, 46b, which emanate from remote center 50b which is remote from the rest of system 10b. Ball bearings 100, as flexures 24, 26, and 28, FIG. 1, enable rotary motion in directions, arrows 120, 122, transverse to the radii. Translational motion mechanism 14b includes plate 22b and an additional plate 124, which may be integral with machine 18. Plate 22b and plate 124 are also interconnected by means of ball bearings 130, which reside in seats 132 and permit a limited amount of translational motion.

A spring 140 or other means may be used to interconnect plate 20b and plate 124 in order to secure the concatenated mechanisms 12b and 14b and permit sufficient freedom of motion for the limited rotational and translational motion required.

Figure 9:
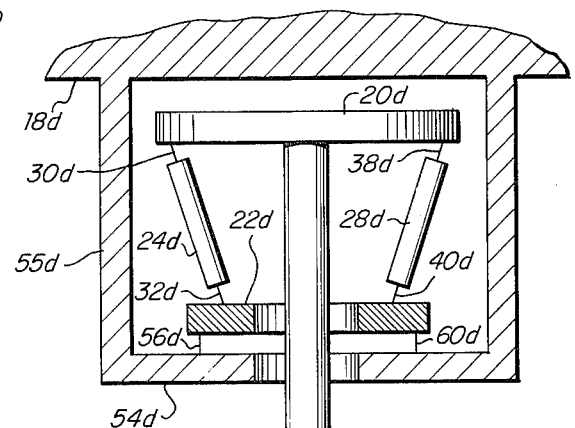
FIG. 9 shows yet another construction for a remote center compliance system according to this invention.

In FIGS. 1 and 6, an axial force along rod 16 in the vertical direction, such as would occur if a piece being fitted by rod 16 became jammed in a hole and the full force of the moving body 18 came to bear on the mechanism, could cause plate 20 to rotate relative to plate 22 as they were moved toward each other, collapsing the entire mechanism including flexures 24, 26, and 28. To prevent this, an alternative remote center compliance system 10d, FIG. 9, is arranged to put flexures 24d, 26d and 28d in tension under those same conditions of excessive axial force applied in the vertical direction. With this arrangement ring 22d is connected directly to ring 54d by means of flexures 56d, 58d, not visible, and 60d. Ring 22d is also interconnected with plate 20d by means of flexures 24d, 26d, not visible, and 28d; while rod 16 depends from plate 20d.

As thus far described, the decoupled, independent translational and rotational motions enabled by the system are effected by two discrete mechanisms, one of which performs solely translational motion, the other of which performs solely rotational motion. However, this is not a necessary limitation of the invention: a single mechanism which enables both motions, or two mechanisms, one of which performs one motion and the other both motions, may be constructed.

Figure 10:
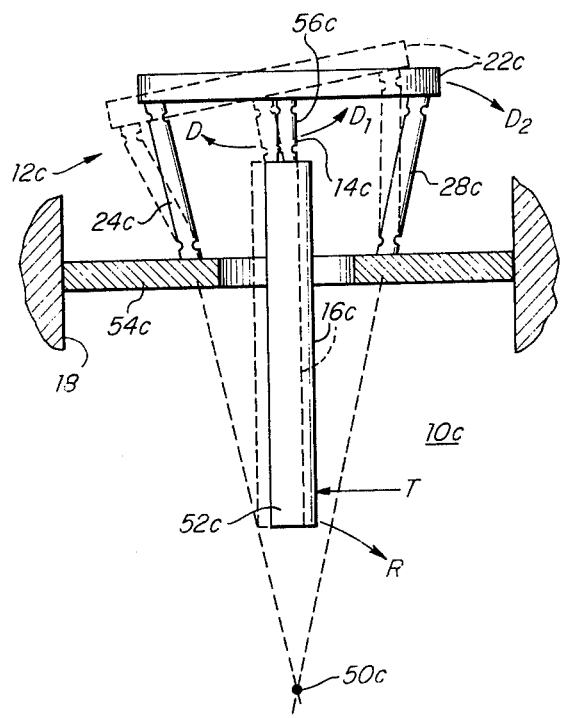
FIG. 10 shows yet another construction for a remote center compliance system according to this invention.
Figure 11:
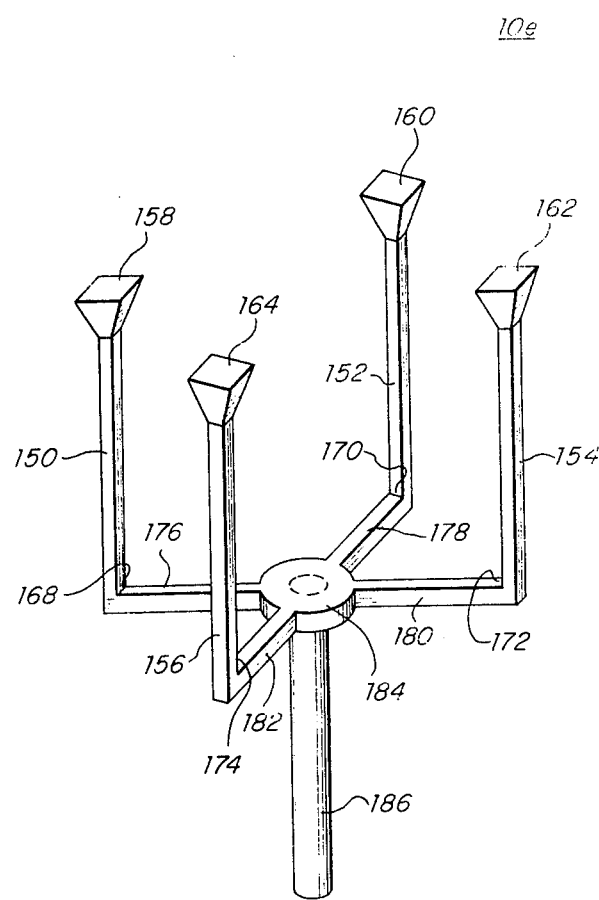
Figure 12:
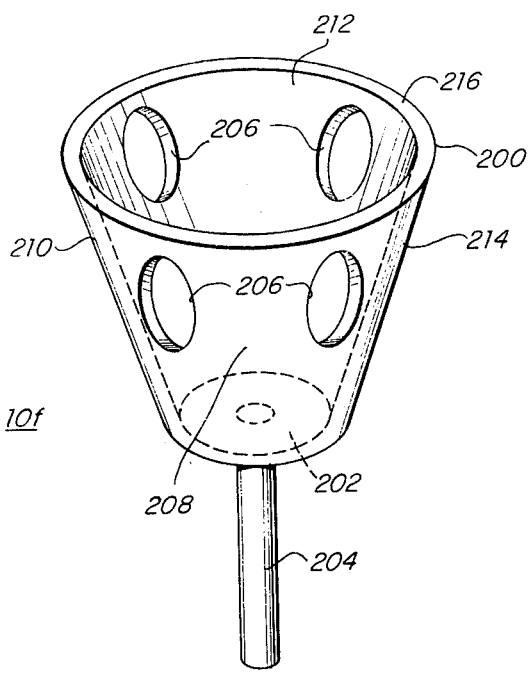
Figure 11A:
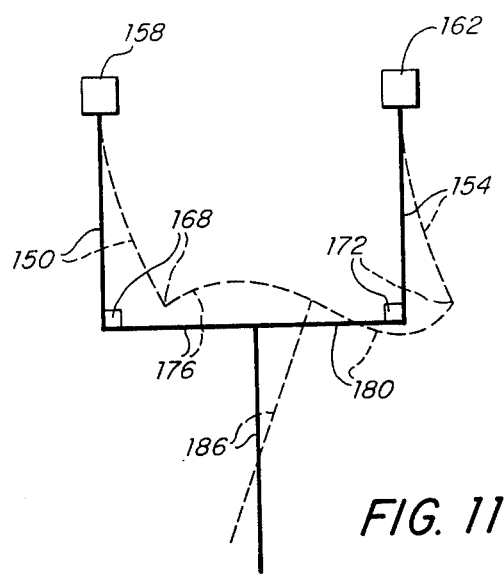

An example of such a device is shown in FIG. 10; a remote center compliance system 10c according to this invention which employs a concatenated rotational mechanism 12c and a translational mechanism 14c suspended from which is an operating member 16c. In this case, the concatenation is formed with the rotary motion mechanism 12c, directly connected to the fixed frame of the machine 18, and translational motion mechanism 14c, interconnected between the rotational mechanism 12c and the operating member 16c. In FIG. 10 rotational mechanism 12c includes flexures 24c, 26c, not visible, and 28c, which support plate 22c. In this construction portion of 54c is one member of the rotational mechanism while member 22c is the other, between which relative rotational motion occurs. Translational motion mechanism 14c includes but one flexure 56c, which is connected between the member, plate 22c, and a member constituted by the upper portion of rod 16c. Flexures 24c, 26c, and 28c lie along radii which emanate from remote center 50c which is beyond even the end 52c of rod 16c.

In operation the decoupled, independent rotational and translational motion occurs from the joint action of the rotational mechanism 12c and translational motion mechanism 14c: a translational force, arrow T, applied to the end 52c of rod 16c, causes plate 22c to rotate about remote center 50c on flexures 24c, 26c, and 28c, at the same time that flexure 56c rotates in a direction, arrow D, so as to bring rod 16c to a laterally displaced position as shown in the dashed lines. A rotational force, indicated by arrow R, applied to the end 52c of rod 16c causes flexure 56c to rotate in the direction of arrow $D_1$ and causes plate 22c to rotate in the opposite direction, arrow $D_2$, from that shown in the dashed lines.

Although each of the constructions illustrated thus far have included discrete engagement between the relatively rotatable parts, this is not a necessary limitation of the invention. For example, those two parts may be sections of a sphere and engage each other by a sliding relative motion by means of low-friction surfaces, coatings, or members.

Other objects, features and advantages will occur to those skilled in the art and are within the following claims:

What is claimed is:

1. A remote center compliance system for an assembler device comprising:
a first member fixed to said assembler device;

a second member;

operator means interconnected with said second member;

a third member intermediately interconnected with said first and second members;

at least three rotational interconnection elements interconnected between said third member and one of said first and second members and disposed along spherical radii of a remote center at, near or beyond the end of said operator means for enabling said operator means to rotate about said remote center; each of said rotational elements including a major motion portion proximate each of said members with which it is interconnected; and a plurality of translational interconnection elements interconnected between said third member and the other of said first and second members and disposed generally parallel to the axis of said operator means for enabling said operator means to translate relative to said first member; each of said translational elements including a major motion portion proximate each of said members with which it is interconnected.

2. The system of claim 1, further including torque resistant means interconnected between said first member and operator means for preventing twisting of the operator means.

* * * * *